United States Patent
El-Ratal

(10) Patent No.: US 7,024,343 B2
(45) Date of Patent: Apr. 4, 2006

(54) METHOD FOR CALIBRATING A MATHEMATICAL MODEL

(75) Inventor: Wissam H. El-Ratal, Sterling Heights, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 573 days.

(21) Appl. No.: 10/000,725

(22) Filed: Nov. 30, 2001

(65) Prior Publication Data

US 2002/0072884 A1    Jun. 13, 2002

Related U.S. Application Data

(60) Provisional application No. 60/251,964, filed on Dec. 7, 2000.

(51) Int. Cl.
*G06G 7/48* (2006.01)

(52) U.S. Cl. .................. 703/6; 703/2; 703/7; 700/98; 356/32

(58) Field of Classification Search .................. 703/2, 703/6, 7; 700/98; 356/32
See application file for complete search history.

(56) References Cited

U.S. PATENT DOCUMENTS

| | | | | |
|---|---|---|---|---|
| 4,969,106 A | * | 11/1990 | Vogel et al. | 382/108 |
| 5,726,907 A | * | 3/1998 | Davidson et al. | 702/42 |
| 5,796,617 A | * | 8/1998 | St. Ville | 700/98 |
| 5,901,072 A | * | 5/1999 | Shimmell | 703/7 |
| 6,219,139 B1 | * | 4/2001 | Lesniak | 356/366 |
| 6,327,030 B1 | * | 12/2001 | Ifju et al. | 356/32 |
| 6,516,099 B1 | * | 2/2003 | Davison et al. | 382/284 |

OTHER PUBLICATIONS

Balci, "Verification, Validation, and Testing" in "Handbook of Simulation", edited by Jerry Banks, John Wiley & Sons, Inc., 1998, pp. 335-337.*

* cited by examiner

*Primary Examiner*—Jean R. Homere
*Assistant Examiner*—Herng-der Day
(74) *Attorney, Agent, or Firm*—Brinks Hofer Gilson & Lione

(57) ABSTRACT

A method is disclosed for calibrating a mathematical model of a component using prototype full-field experimentally collected deformation/strain data. Specifically, the method involves obtaining actual experimental field data using strain sensitive coating material and then mapping said data on a CAD mesh model. The analytical mesh model is then compared to a finite element model that is based on theoretical values referred to as boundary conditions. The finite element model boundary conditions are then calibrated to reflect the values derived from the experimental field measurements. Once calibrated, the model can be used to optimize design of components.

11 Claims, 3 Drawing Sheets

METHOD FOR CALIBRATING A MATHEMATICAL MODEL

CLAIM FOR PRIORITY

The present application claims priority from U.S. Provisional Application Serial No. 60/251,964, filed Dec. 7, 2000, which is fully incorporated herein.

FIELD OF THE INVENTION

The present invention generally relates to component design. In particular, the invention relates to a more accurate and efficient method of modeling components.

BACKGROUND OF THE INVENTION

The current preferred method for optimizing the design of components is by the use of Computer Aided Engineering ("CAE"). Traditional CAE methods typically utilize finite element analysis ("FEA"), which in turn is based on computer models of the part.

Currently, CAE methods typically rely on theoretical mathematical models run through a computer simulation. The results of the analysis are only as accurate as the model. Accuracy of the model is typically a function of the time, effort and skill an engineer puts into creating the model. Model accuracy is also dependent on the accuracy and inherent assumptions of the code.

Once the model is completed, it often must be calibrated to the physical embodiment that it represents in order to produce realistic failure mode and durability predictions. Calibration is typically based on data collected from discrete points through the use of strain gauges on a physical model. Calibrating the model based on this "strain gauge method" is subject to many inaccuracies. Strain gauge size, direction, and placement are key contributors to inaccuracy. Strain gauges are sometimes difficult to install on certain surfaces with high stress concentrations (fillet, hole, etc.) and sometimes impractical for use in measuring strain that is induced under certain circumstances (e.g., high strain gradient). Strain gauges are generally referred to as "point-measuring sensors." The strain gauge gridlines measure only the deformation component in its application direction and at its location. It reports only the average value of measured deformation over the area occupied by the strain gauge. Since strain gauges measure strain at discrete points, poor selection of the strain gauge location can contribute to inaccuracy. Extrapolation of strain gauge results on a three dimensional part with odd geometry can also result in an inaccurate model. In addition, strain gauge instrumentation of larger parts can take up substantial amounts of engineer and technician time.

It would be desirable, therefore, to provide a method for calibrating and verifying mathematical models that is faster, more flexible, more accurate, less dependant on technician skill and less expensive than traditional methods.

SUMMARY OF THE INVENTION

The present invention overcomes the disadvantages of the prior art approaches by providing an improved method for accurately modeling the characteristics of a component.

In one embodiment of the present invention, a method for calibrating a mathematical model is disclosed. The method provides for coating a component with a material capable of full-field optical indication of gradients of surface strain. A set of loads is thereafter applied to said component. Once the mechanical strain is induced, the optical indication of gradient of the strain is perceived so as to obtain a physical result map of said strain. Also contemplated in this embodiment is an uncalibrated mathematical model of the component. A theoretical set of boundary conditions is applied to the uncalibrated mathematical model so as to obtain a model strain result map. The model strain results are then compared to the physical results. Thereafter, a new set of boundary conditions is computed and used to generate the model strain results that substantially equal the physical strain values.

In another embodiment of the invention, the method is utilized for optimizing component design. After a mathematical model is calibrated as above, multiple designs for a specific component can be run through the model so as to provide an accurate measure of each design's capabilities when subjected to stress. Based on these results, a specific design fitting a specific need can be selected by the user or manufacturer.

In yet another embodiment of the invention, a computer system for mapping experimental data onto a three-dimensional computer model is disclosed. The computer system utilizes a processor and a camera. The system further utilizes a software program for receiving data based on experimental results. The software program then maps the data from the experimental results onto a three-dimensional computer model.

BRIEF DESCRIPTION OF THE DRAWINGS

These and other aspects of the invention will appear from the following written description, and from the drawings, in which.

DESCRIPTION OF THE PREFERRED EMBODIMENT

Figure 1:
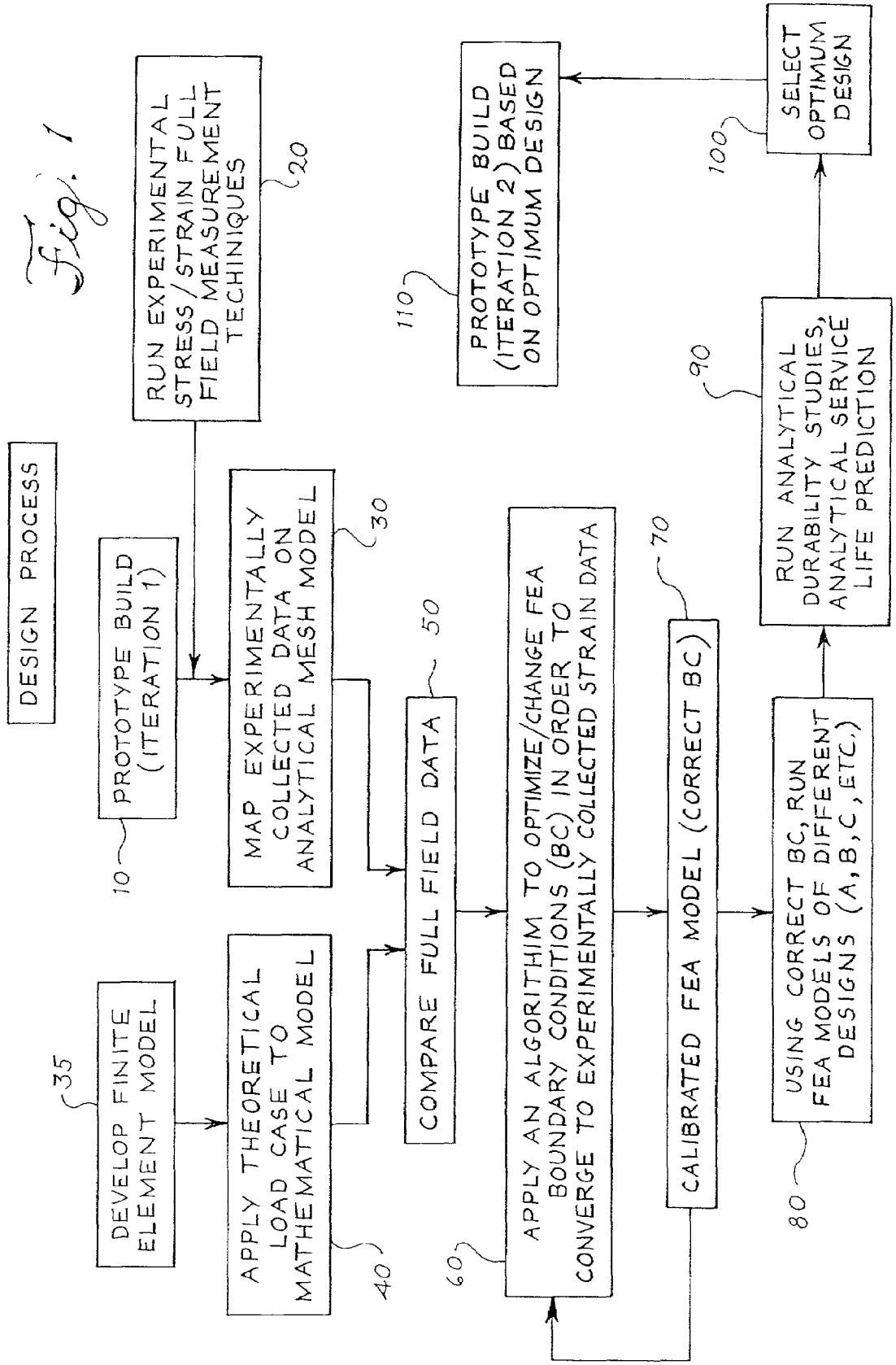
FIG. 1 is a flowchart describing a preferred embodiment of the method for calibrating a mathematical model using a strain sensitive coating, and for optimizing component design through the use of calibrated mathematical model.

Referring now to the drawings, FIG. 1 shows a preferred embodiment of the method for calibrating a mathematical model, as well as optimizing the design of a component.

Referring to FIG. 1, the first step 10 requires building a prototype of the physical component to be subjected to analysis. This prototype of a component is restricted only by a manufacturer's imagination and needs. In other words, it is contemplated that the following method for optimizing a mathematical model is not restricted by the size or shape of a component.

Step 20 involves running physical strain tests on the prototype component of step 10 in order to develop a full field measurement. A full field measurement reflects measurement of the component at continuous points when the component is subjected to stress or strain. Several full-field measurement techniques exist including, but not limited to, moire interferometry, geometric moire, SPATE, speckle methods, holographic interferometry, brittle and photoelastic coatings, as well as digital image correlation. These techniques are well known in the art. The method for performing these physical strain tests in the preferred embodiment involves the use of Strain Sensitive Coating (SSC).

The SSC, as contemplated by the invention, is a polymer-based coating that can be applied to the surface of a component. The SSC, upon illumination with a light source, emits light at a different wavelength. The SSC can be composed of any number of high modulus polymeric or related materials such as poly(methylmethacryate), poly (imide), poly(esters), polyamine, (poly(melamines), poly (urethanes), etc. The substrate of the SSC may be any number of metals, organic polymers, composites and ceramics.

Luminescent compounds are blended into the SSC to emit light. Examples of luminescent compounds and conjugated organic dyes such as rhodamine B, poly(phenylene vinylene) and cyanines.

The luminescent dye that is dissolved in the polymer emits green or red light when the SSC is illuminated with near-UV or blue light. The luminescence intensity of the dye that is dissolved in the high modulus polymer coating increases when the substrate is subjected to mechanical strain. This effect is due to a combination of two factors: (1) the fluorescent light that is visible to an observer is attenuated because of total internal reflection at the polymer/air interface; and (2) cracks in the polymer film interrupt total internal reflection and allow the fluorescent light to emanate more efficiently from the film. The end result is that the fluorescent intensity that is visible to an observer is approximately linearly proportional to the mechanical strain on the underlying substrate.

The coating is formulated so that it can be applied to a physical model. One example would be formulating the coating in aerosol form so that it could be applied as a thin film on the physical model.

The mechanical strain that the component is subjected to can be imaged/measured through a variety of methods. One method is the visual or automated inspection of the luminescence intensity through green or red color glass filter. Another method is to use still photography using silver halide film technology through a green or red color glass filter. Still another method is to use analog video photography through a green or red color glass filter. Finally, digital photography using a scientific grade CCD camera through a red or green color glass filter. In each case the spatial resolution of the visualization system is adjusted such that the individual stress-induced cracks are not observed in the image, but rather an average intensity that is proportional to stress is observed over a region. The luminescence intensity distribution that is imaged by any of these methods can be used to produce a map of the mechanical strain field on the underlying substrate.

Thus, step 20, as contemplated by the invention, involves coating the component with the SSC. Then, the strain on the component is measured—some of the methods for doing so have been described above.

Step 30 requires mapping the experimental results obtained from the previous step onto an analytical CAD mesh model. To understand this step, it should be noted that the physical tests, as previously indicated, are preferably recorded using cameras. A camera gives a two-dimensional view of the strain on the physical part whereas typical engineering software provides a three-dimensional view of the surface geometry of a specific component. Thus, the data mapping (image resectioning) referred to in this step represents the transformation of two-dimensional views from the camera onto a three-dimensional CAD model of the component's surface geometry. Moreover, by using several cameras, multiple views of a component can be mapped simultaneously allowing a user viewing the model to see specific strain gradients. A system for this step 30 is described more fully in FIG. 3.

Step 35 involves developing a finite element model for said physical component. This is accomplished through a variety of methods well known within the art. One example is using CAE software.

Step 40 involves applying theoretical values or "boundary conditions" to the finite element model. Boundary conditions refer to loads and constraints that are placed on the model related to such things as materials, load capabilities, etc. These conditions are based on assumptions traditionally used in mechanical design. These boundary conditions are formulated to simulate the behavior of the physical component in its working environment. By "applying" it is meant that data is entered into the finite element model where unknown values exist.

Next, as shown in 50, the physical measurement data is compared to the theoretical mathematical model. This requires comparing the theoretical results based on the boundary condition assumptions when juxtaposed with the actual experimental field measurements. This comparison is done so as to ascertain the differences between the actual physical results and the model results. There will almost always be differences as it is unlikely that the theoretical result will initially match the actual physical result. It is from this ascertained difference that a calibration can be done so as to match the theoretical result with the actual physical result.

It is at step 60 that the theoretical model is optimized or calibrated using the actual values derived from the physical tests. This calibration is performed through adjusting the boundary conditions, that is, the theoretical "assumptions" used in the uncalibrated mathematical model, so that the boundary conditions reflect the realities derived from the strain tests using the actual prototype component. In other words, the "real" data from the physical results is converged into the theoretical model so that the assumptions of the theoretical model are now replaced with this real data. This convergence of the strain data from the physical results with the theoretical mathematical model optimizes the model so that accurate representations of components in the environment in which they will be used can be analyzed. This "iterative optimization technique" is preferably accomplished through the use of a computer and an accompanying computer program.

Step 70 merely reflects that the new model is calibrated. Again, this calibration occurs through the algorithmic matching of physical data with theoretical assumption so as to calibrate the theoretical model. Of note is that step 60 is repeated if necessary, that is, the algorithmic calibration is repeated until the model is accurately calibrated.

As shown is step 80, once the model is calibrated so that the theoretical results match the actual physical results, the model can be used to test different designs for the component without the need to physically build them.

At step 90, the calibrated model is utilized to run various durability studies on a computer. To "run" refers to utilizing a computer and, most often, a computer program, to effectuate the evaluation of certain designs in view of the modeled data. Referring again to the durability studies, static loads represent theoretical loads that are placed on the component when in operation. Dynamic loads represent the actual load that is placed on said component when in operation. Dynamic load data is gleaned from a historical database. The static load variable is replaced with the dynamic load variable. Once completed, analytical durability tests can be run on the component. Owing to the improved accuracy of the calibration process, these analytical durability tests can accurately predict a component's service life. In addition, these tests reveal the source of where the component will fail. In other words, after running these analytical durability tests based on the calibrated model, it can be determined where (on what part of the component) and when the component will fail.

Step 100 refers to selecting the preferred design iteration for the component based on testing the various models in accordance with the calibrated model boundary conditions. What constitutes an "optimum" or preferred design will, in large part, be from the viewpoint of the manufacturer. Still, regardless of what is determined to be the best design by the user/manufacturer, by using the current invention, an optimum design for the specific need can be achieved more efficiently.

The final step of the preferred embodiment of the inventive method involves building a prototype 110 according to the calibrated model based on a determination of the optimum design. This step is also defined by being the second iteration in the design process. This is significant in that the current inventive method reduces the number of physical prototype build iterations typically utilized in component design from three or more to two.

Figure 2:
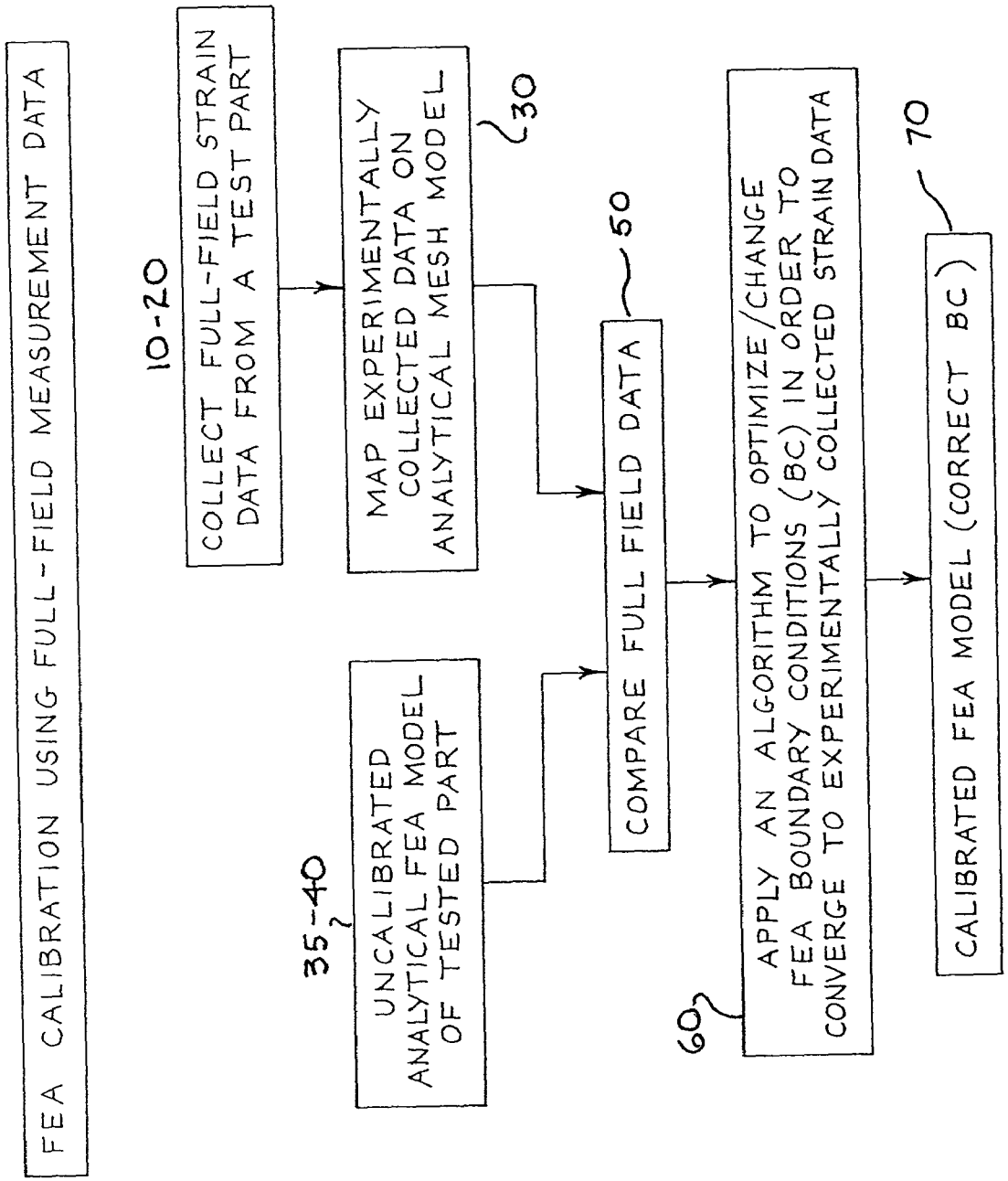
FIG. 2 is a flowchart showing an abridged version of the preferred embodiment of the method for calibrating a mathematical model using a strain sensitive coating, and for optimizing component design through the use of a calibrated mathematical model.

FIG. 2 shows an abridged version of the foregoing steps and description with respect to the preferred embodiment of the inventive method. This figure is useful as it further simplifies the preferred method in showing the preferred steps that lead to the calibration of the FEA model.

As can be seen in the drawing, steps 35 and 40 of FIG. 1 have been integrated into the step requiring an "Uncalibrated Analytical FEA Model Of Tested Part." Likewise, steps 10 and 20 of FIG. 1 have been integrated into the step of "Collect Full-Field Strain Data From A Test Part." From these two integrated steps forward, the drawing shows the identical steps as described in FIG. 1, ending with the calibration of the mathematical model.

Figure 3:
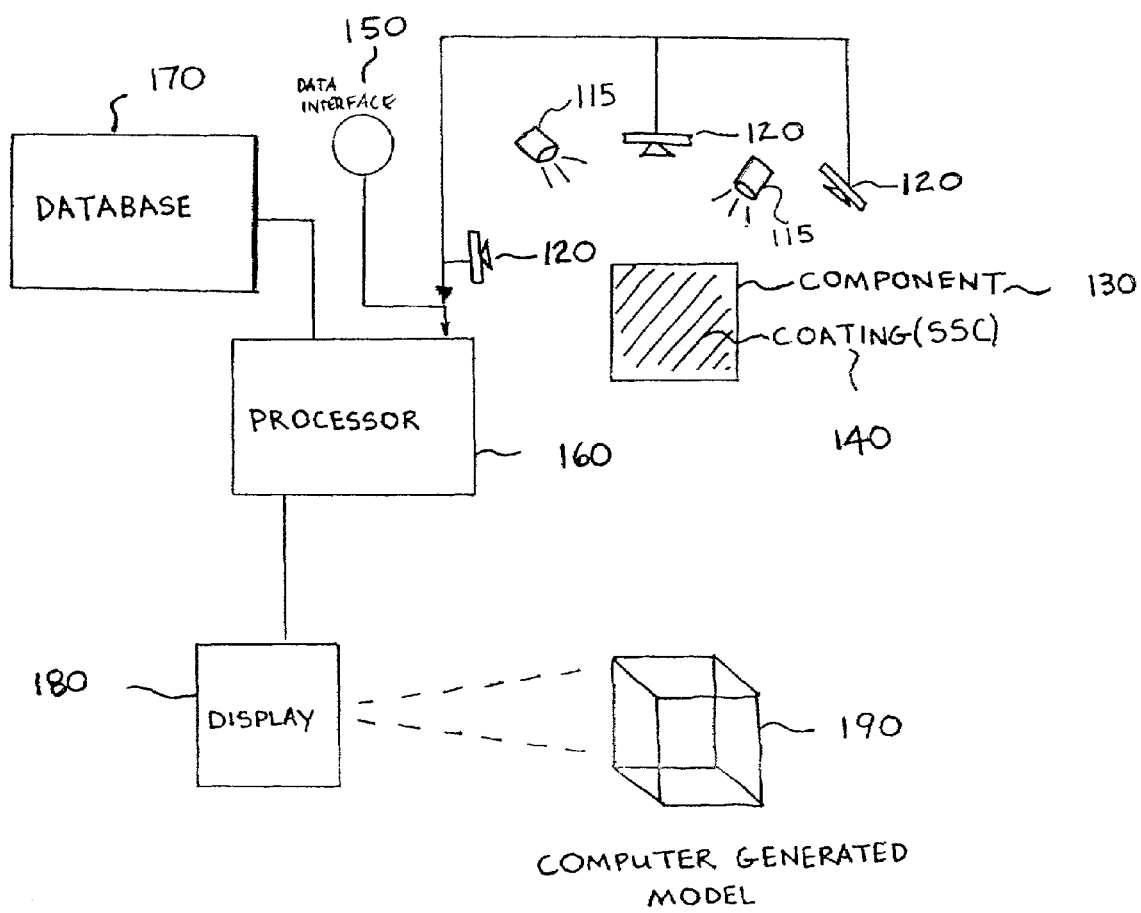
FIG. 3 shows a system for mapping experimental results onto an analytical Computer Aided Drafting ("CAD") mesh model.

FIG. 3 shows a system for mapping experimental results onto an analytical mesh model. As shown in the drawing, the system includes one or more lights 115 and cameras 120 arranged in any working configuration around a component 130 that is coated with the SSC 140. Once the component is subjected to strain, the cameras image the result. The methods and use of cameras 120 to record such data has been previously described. The system includes a data interface 150. The data interface 150 represents the collection of data, from the physical tests as recorded in the images of the cameras 120, and the passing of such data on to a computer processor 160. The preferred embodiment of the data interface would entail the manual entering of the data from the physical tests into the processor 160. Other embodiments of the data interface could include another computer or even a computer network. As can be further seen in the drawing, the processor 160 is in electronic or digital communication with a database 170 as is well known in the art. The database 170 can house any assortment of information. Examples of database information that would be available in the preferred embodiment would be field measurement data for material characteristics, load capabilities, etc. The processor 160 is also in similar communication with a display 180 that is capable of showing a computer-generated model 190. In the preferred embodiment, the display 180 would be a computer monitor. The linking of a processor 160 with a display 180 is similarly well known in the art. The computer-generated model 190 is displayed through the use of computer software in the preferred embodiment.

Various other modifications to the present invention may occur to those skilled in the art to which the present invention pertains. For example, computer automated iteration of the steps that alter and recheck the boundary conditions, assumptions and finite element mesh configurations of the mathematical model. Additionally, the entire analysis process as described can be used iteratively to progressively evolve designs of the prototype so as to result in a method for optimizing the design of the prototype. Other modifications not explicitly mentioned herein are also possible and within the scope of the present invention. It is the following claims, including all equivalents, which define the scope of the present invention.

I claim:

1. A method for calibrating a mathematical model comprising the steps of:
   (a) providing a component, said component coated with a material providing an optical indication of gradients of surface strain;
   (b) applying a mechanical strain to said component;
   (c) perceiving said optical indication of gradients of surface strain to obtain a physical result;
   (d) providing an uncalibrated mathematical model of said component wherein said component includes a surface geometry and said uncalibrated mathematical model includes boundary conditions;
   (e) applying a theoretical value of said boundary conditions to said uncalibrated mathematical model to obtain a model result;
   (f) comparing said uncalibrated mathematical model result to said physical result; and
   (g) adjusting said uncalibrated mathematical model boundary conditions until said model result substantially equal said physical result.

2. A method according to claim 1, wherein said uncalibrated mathematical model comprises a finite element model.

3. A method according to claim 1, wherein said step of perceiving said optical indications of gradients of surface strain is further compared using a camera.

4. A method according to claim 1, wherein the step of adjusting said uncalibrated mathematical model result until it substantially equals said physical result comprises using a computer.

5. A method for optimizing design of components comprising the steps of:
   providing a component;
   coating component with a material providing an optical indication of gradients of surface strain;
   applying a load to said component:
   perceiving said optical indication of gradients of surface strain to obtain a physical result;
   comparing an uncalibrated mathematical model result having boundary conditions and a surface geometry to said physical result;
   adjusting said uncalibrated mathematical model boundary conditions until said uncalibrated mathematical model result substantially equals said physical result, to arrive at an adjusted model of at least one design of said component;
   providing a plurality of designs of said component;
   running said adjusted model of said plurality of designs of said component; and based on result of running said adjusted model of said plurality of designs of said component, select optimum design, in accordance with manufacturers specifications, for said component.

6. A method according to claim 5, wherein said uncalibrated mathematical model comprises a finite element model.

7. A method according to claim 5, wherein said step of perceiving said optical indications of gradients of surface strain is further compared using a camera.

8. A method according to claim 5, wherein the step of adjusting said uncalibrated mathematical model boundary conditions until the model result substantially equal said physical result comprises using a computer.

9. A method according to claim 5, wherein the step of running said adjusted model of said plurality of designs of said component further comprises the steps of:
   running analytical durability studies on each of said designs; and
   running an analytical service life prediction on each of said designs.

10. A method for calibrating a mathematical model comprising the steps of:
   (a) providing a component, said component tested with full field measurement techniques providing an optical indication of gradients of surface strain;
   (b) applying a load to said component;
   (c) perceiving said optical indication of gradients of surface strain to obtain a full field result;
   (d) providing an uncalibrated mathematical model of said component wherein said component includes a surface geometry and said uncalibrated mathematical model includes boundary conditions;
   (e) applying a theoretical value of said boundary conditions to said uncalibrated mathematical model to obtain a model result;
   (f) comparing said uncalibrated mathematical model result to said full field result; and
   (g) adjusting said uncalibrated mathematical model boundary conditions until said model result substantially equal said full field result.

11. A method for optimizing design of components comprising the steps of:
   providing a component;
   testing said component using full field measurement techniques providing an optical indication of gradients of surface strain;
   applying a load to said component;
   perceiving said optical indication of gradients of surface strain to obtain a full field result;
   comparing an uncalibrated mathematical model result to said full field result wherein said uncalibrated mathematical model further comprises boundary conditions, and a surface geometry;
   adjusting said uncalibrated mathematical model boundary conditions until result substantially equals said full field result, which results in an adjusted model of at least one design of said component;
   providing a plurality of designs of said component;
   running said adjusted model of said plurality of designs of said component; and
   based on result of running said adjusted model of said plurality of designs of said component, selecting an optimum design for said component.

* * * * *